United States Patent
Asami

(10) Patent No.: US 6,801,145 B2
(45) Date of Patent: Oct. 5, 2004

(54) INTERLEAVING A/D CONVERSION TYPE WAVEFORM DIGITIZER MODULE AND A TEST APPARATUS

(75) Inventor: Koji Asami, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/366,645

(22) Filed: Feb. 13, 2003

(65) Prior Publication Data

US 2004/0080442 A1 Apr. 29, 2004

Related U.S. Application Data

(63) Continuation of application No. PCT/JP02/00455, filed on Jan. 23, 2002.

(30) Foreign Application Priority Data

Jan. 24, 2001 (JP) ........................................ 2001-015149

(51) Int. Cl.[7] ............................................... H03M 1/06
(52) U.S. Cl. ...................... 341/118; 341/120; 341/155
(58) Field of Search ................................. 341/118, 120, 341/119, 155, 156, 159, 126; 708/404, 405, 409

(56) References Cited

U.S. PATENT DOCUMENTS

| 4,736,189 | A | * | 4/1988 | Katsumata et al. | ......... 341/120 |
|---|---|---|---|---|---|
| 4,763,105 | A | * | 8/1988 | Jenq | ............................. 341/120 |
| 5,239,299 | A | * | 8/1993 | Apple et al. | ................. 341/118 |
| 5,537,113 | A | * | 7/1996 | Kawabata | .................... 341/141 |
| 6,384,756 | B1 | * | 5/2002 | Tajiri et al. | .................. 341/120 |
| 6,452,518 | B1 | * | 9/2002 | Kawabata | .................... 341/118 |

FOREIGN PATENT DOCUMENTS

JP          2000-346913          12/2000

OTHER PUBLICATIONS

Translation of International Preliminary Examination Report for International Application No. PCT/JP02/00455, dated Mar. 6, 2003, 3 pages.
Yih–Chyun Jenq, Digital Spectra of Nonuniformly Sampled Signals: A Robust Sampling Time Offset Estimation Algorithm for Ultra High–Speed Waveform Digitizers Using Interleaving, IEEE Transaction on Instrumentation and Measurement, vol. 39, No. 1, Feb. 1990, 5 pgs.

* cited by examiner

*Primary Examiner*—Brian Young
*Assistant Examiner*—John B Nguyen
(74) *Attorney, Agent, or Firm*—Osha & May L.L.P.

(57) ABSTRACT

An interleaving A/D conversion type waveform digitizer module comprising a means for eliminating spurious components resulting from phase errors according to N A/D converters, wherein the digitizer samples signals continually with a predetermined timing corresponding to a interleaving configuration of the A/D converters, receives signals outputted by a tested device to be tested, converts the signals into digital signals, performs Fourier-transform of the digital signals and performs interleaving.

16 Claims, 5 Drawing Sheets

INTERLEAVING A/D CONVERSION TYPE WAVEFORM DIGITIZER MODULE AND A TEST APPARATUS

This patent application is a continuation application of an international patent application No. PCT/JP02/00455 filed on Jan. 23, 2002 claiming priority from a Japanese patent application No. 2001-15149 filed on Jan. 24th 2001, the contents of which are incorporated herein by reference.

TECHNICAL FIELD

The present invention relates to an interleaving A/D conversion type waveform digitizer module and a test apparatus thereof. More particularly, the present invention relates to a digitizer module for detecting measurement errors accompanied by phase errors of sampling timing in interleaving A/D converting and correcting the errors.

RELATED ART

An N way interleaving. A/D (i.e. analog/digital) conversion type digitizer module, which uses N A/D converters, is capable of increasing a sampling rate in appearance, but on the other hand it is required to sample signals with a precise sampling timing.

In this example, it is described below to let a interleaving constant be 2. And, it is described to let the number of time series data be 4096 pieces of data, which are 2 to the power 12. The digitizer module includes two A/D converters and a Fourier-transform unit. The A/D converters convert analog signals into digital signals at a constant sampling rate. The two A/D converters increase the sampling rate in appearance by sampling the analog signals in turn. In this example, it is to let the data sampled by the two A/D converters be 4096 data series. The Fourier-transform unit performs Fourier-transform of the digital signals sampled by the A/D converters.

The Fourier-transform unit receives the digital signal data series sampled by the A/D converters and outputs 4096 pieces of frequency spectrum data resulting from a fast Fourier-transform (FFT). The Fourier-transform unit includes a first FFT unit, a second FFT unit and a butterfly operation unit. Each of the first FFT unit and the second FFT unit receives 2048 time series data and outputs 2048 pieces of mid-data (complex data) resulting from FFT. The butterfly operation unit performs the last part of a butterfly operation well known as used for FFT process.

The butterfly operation unit performs a butterfly operation on the data from the first FFT unit and the second FFT unit and outputs 4096 pieces of frequency spectrum data resulting from the well-known butterfly operation to which FFT process is applied.

As a configuration example of a digitizer module for the semiconductor type test apparatus, there is a digitizer module including a first A/D converter to which analog signals are transmitted by a device to be tested, a second A/D converter, an arrangement unit and a Fourier-transform unit. Here, the two A/D converters have the entirely same characteristic of sampling timing including a group delay characteristic and an aperture delay characteristic. Usually, sampling data sampled by the two A/D converters is stored first in a buffer memory installed, then the data is provided to the Fourier-transform unit and an operation is performed thereon.

Analog signals for testing outputted by a device to be tested are provided to input terminals of both the first A/D converter and the second A/D converters and the first A/D converter performs sampling on even data series. It is to let outputted even time series data be D0, D2, D4, . . . . And, the second A/D converter performs sampling on odd data series. It is to let outputted odd time series data be D1, D3, D5, . . . . The arrangement unit receives the two time series data and outputs time series data D0, D1, D2, D3, D4, D5, . . . arranged in turn.

Phase adjustment should be done to make phase differences between the sampling timings of the two A/D converters be a constant difference. And also if there is a phase error, proper frequency spectrum data cannot be obtained because FFT process is performed on data sampled with a constant time interval.

As described above, in prior art, sampling timing of a plurality of A/D converters does not change and a sampling clock rate is constant or within an error-allowed range. Meanwhile, a sampling characteristic of the A/D converter brings about a change in sampling with a constant time interval, which is desirable, because of a difference in quality of parts of A/D converter itself, surroundings temperature, a change according to time laps and a change in power source voltage. And, the group delay characteristic is changed according to a change in a clock frequency for sampling in the case of using, for example, the semiconductor type test apparatus substantially changing the sampling frequency. Accompanied by these causes, a change arises from sampling timing of an ideal state. That is, in the case of desiring a high precision frequency spectrum of an input signal, a practical problem not preferable to the prior apparatus.

SUMMARY OF THE INVENTION

Therefore, it is an object of the present invention to provide an interleaving A/D conversion type digitizer module and a semiconductor test apparatus for correcting an operation process of a Fourier-transform unit on the basis of phase difference between the sampling timings of a plurality of A/D converters. The above and other objects can be achieved by combinations described in the independent claims. The dependent claims define further advantageous and exemplary combinations of the present invention.

According to the first aspect of the present invention, a digitizer module for converting an analog signal outputted by an electronic device into a digital signal, comprises at least two A/D converters for converting an analog signal outputted by the electronic device into a digital signal, each of the A/D converters operating with different sampling timing, a Fourier-transform unit for performing Fourier-transform on each of the digital signals converted by the at least two A/D converters and outputting a transformed signal, and an interleaving unit for generating a data sequence in which the transformed signal outputted by the Fourier-transform unit is comprised, wherein the interleaving unit comprises a spurious elimination means for eliminating a spurious component in the transformed signal resulting from a phase error between an ideal sampling timing, with which each of the at least two A/D converters should perform sampling on each of the analog signals, and the sampling timing, with which each of the at least two A/D converters performs sampling on each of the analog signals.

The interleaving unit further may comprise an aliasing elimination means for eliminating an aliasing component of the spurious component.

The spurious elimination means may calculate a correction factor on the basis of each of the transformed signals by using the phase error and a boundary condition, under which the spurious component in the transformed signal does not exist, and eliminates the spurious component on the basis of the correction factor.

The spurious elimination means may calculate the correction factor for each of the transformed signals outputted by the Fourier-transform unit corresponding to each of the at least two A/D converters, and eliminates the spurious component on the basis of the correction factor.

The ideal sampling timing may be defined as a sampling timing with which each of other A/D converters performs sampling in turn at a constant time interval in case one of sampling timings of the at least two A/D converters is regarded as a reference sampling timing, and the spurious elimination means may calculate the correction factor on the basis of each of the phase errors between each of sampling timings of the other A/D converters and the ideal sampling timing, and may eliminate the spurious component on the basis of the correction factor.

The spurious elimination means may multiply each of the transformed signals by the correction factor calculated for each of the transformed signals.

The spurious elimination means may calculate the correction factor to eliminate components other than a signal component of the analog signal and the aliasing component of the signal component when a total sum of the N transformed signals multiplied by the correction factor are calculated.

The spurious elimination means may calculate the correction factor for each of a plurality of bands, into which a band of the transformed signal is divided, on the basis of a phase of sampling timing of the at least two A/D converters.

The spurious elimination means may calculate the correction factor by using a simultaneous equation.

An sampling pulse, with which the at least two A/D converters perform sampling on the analog signal, is given by:

$$p_m(t) = \sum_{r=-\infty}^{\infty} \sigma\{t - (N \times r + m)Ts) - \tau_m\},$$

where N denotes the number of the at least two A/D converters, m denotes an integer in a range of 0(zero) to (N-1), t denotes time, Ts denotes a phase interval of each of the at least two A/D converters, m denotes an m-th A/D converter and τ denotes the phase error of the at least two A/D converters, a Fourier-transform of sampling series of the analog signal sampled by the at least two A/D converters is given by:

$$Xm(f) = \frac{1}{N \times Ts} \sum_{r=-\infty}^{\infty} X\left(f - \frac{r}{N \times Ts}\right) e^{-j\pi \frac{r}{2}(m+\frac{\tau m}{Ts})},$$

that is, $$X_0(f) = \bar{x}(-k) + \ldots + \bar{x}(-1) + \bar{x}(0) + \bar{x}(1) + \ldots + \bar{x}(l)$$

$$X_1(f) = c_1^{-k}\bar{x}(-k) + \ldots + c_1^{-1}\bar{x}(-1) + \bar{x}(0) + c_1\bar{x}(1) + \ldots + c_1^l\bar{x}(l)$$

$$X_2(f) = c_2^{-k}\bar{x}(-k) + \ldots + c_2^{-1}\bar{x}(-1) + \bar{x}(0) + c_2\bar{x}(1) + \ldots + c_2^l\bar{x}(l)$$

$$\vdots$$

$$X_{N-1}(f) = c_{N-1}^{-k}\bar{x}(-k) + \ldots + c_{N-1}^{-1}\bar{x}(-1) + \bar{x}(0) + c_{N-1}\bar{x}(1) + \ldots + c_{N-1}^l\bar{x}(l)$$

(where, in case a band of X(f) is [-2 fs, 2 fs], terms having r in a range of -k to l in the above equation are components within a band [0, 4 fs], and are cm and x(r) are respectively given by:

$$c_m = e^{-j\frac{\pi}{2}(r+\tau_m/Ts)}, \quad \bar{x}(r) = \frac{1}{NTs} X\left(f - \frac{r}{NTs}\right),$$

and in case the aliasing component related to 2 fs, which is a frequency of signal component x^(0), is x^(u) (where x^ is a substitute notation for $\bar{x}$.), the spurious elimination means may calculate the correction factor $L_1, L_2, \ldots L_{N-1}$ to satisfy a equation given by:

$$X_0(f) + L_1 X_1(f) + L_2 X_2(f) + \ldots + L_{N-1} X_{N-1}(f) = a\bar{x}(0) + b\bar{x}(u),$$

where either a or b is a random real number.

The Fourier-transform unit outputs the transformed signal DFTm(r) resulting from a Fourier-transform of the digital signal outputted by the at least two A/D converters, and for a first band, in which the signal component x^(0) exists, the spurious elimination means calculates a Fourier-transform X(f)=X(r/NTs) of the analog signal using a equation given by:

$$X\left(\frac{r}{NTs}\right) = \frac{1}{1 + L_1 + L_2 + \ldots + L_{N-1}} \{DFT_0(r) + L_1 e^{-j2\pi\frac{r}{N}(1+\tau_1/Ts)} DFT_1(r) +$$

$$L_2 e^{-j2\pi\frac{r}{N}(2+\tau_2/Ts)} DFT_2(r) \ldots +$$

$$L_{N-1} e^{-j2\pi\frac{r}{N}(N-1+\tau_{N-1}/Ts)} DFT_{N-1}(r)\},$$

while for a second band, in which aliasing component x^(u) of the signal component x^(0) exists, the spurious elimination means may calculate a Fourier-transform X(f)=X(r/NTs) of the analog signal using a equation given by:

$$X\left(\frac{r}{NTs}\right) = \frac{1}{1 + \sum_{n=1}^{N-1} c_n^u L_n} \{DFT_0(r) + L_1 e^{-j2\pi\frac{r}{N}(1+\tau_1/Ts)} DFT_1(r) +$$

$$L_2 e^{-j2\pi\frac{r}{N}(2+\tau_2/Ts)} DFT_2(r) \ldots +$$

$$L_{N-1} e^{-j2\pi\frac{r}{N}(N-1+\tau_{N-1}/Ts)} DFT_{N-1}(r)\}.$$

The first band may be in a frequency range of 0 to 2 fs, and the second band may be in a frequency range of 2 fs to frequency 4 fs.

A digitizer module comprising four A/D converters, wherein a sampling pulse with which the four A/D converters perform sampling on the analog signal is given by:

$$p_m(t) = \sum_{r=-\infty}^{\infty} \sigma\{(t - (4r + m)Ts) - \tau_m\},$$

where m denotes an integer 0 to 3, t denotes time, Ts denotes a phase interval of each of the four A/D converters, m denotes an m-th A/D converter and τ denotes the phase error of each of the four A/D converters, a Fourier-transform of sampling series of the analog signal sampled by each of the four A/D converters is given by:

$$Xm(f) = \frac{1}{4Ts} \sum_{r=-\infty}^{\infty} X\left(f - \frac{r}{4Ts}\right) e^{-j\pi\frac{r}{2}(m+\frac{\tau m}{Ts})},$$

-continued that is, $$X_0(f) = \bar{x}(-1) + \bar{x}(0) + \bar{x}(1) + \ldots + \bar{x}(5)$$

$$X_1(f) = c_1^{-1}\bar{x}(-1) + \bar{x}(0) + c_1\bar{x}(1) + \ldots + c_1^5\bar{x}(5)$$

$$X_2(f) = c_2^{-1}\bar{x}(-1) + \bar{x}(0) + c_2\bar{x}(1) + \ldots + c_2^5\bar{x}(5)$$

$$X_3(f) = c_3^{-1}\bar{x}(-1) + \bar{x}(0) + c_3\bar{x}(1) + \ldots + c_3^5\bar{x}(5),$$

(where, in case a band of X(f) is [−2 fs, 2 fs], terms having r in a range of −1 to 5 in the above equation are components within a band [0, 4 fs], and cm and x(r) are respectively given by:

$$c_m = e^{-\frac{j\pi}{2}(r+\tau_m/T_s)}, \quad \bar{x}(r) = \frac{1}{4Ts}X\left(f - \frac{r}{4Ts}\right)),$$

and in case the aliasing component related to 2 fs, which is a frequency of signal component x^(0), is x^(4) (where x^ is a substitute notation for $\bar{x}$), the spurious elimination means may calculate the correction factor $L_1$, $L_2$ and $L_3$ to satisfy a equation given by:

$$X_0(f) + L_1X_1(f) + L_2X_2(f) + \ldots + L_3X_3(f) = a\bar{x}(0) + b\bar{x}(4),$$

where either a or b is a random real number.

For a third band in a frequency range of 0 to fs, the correction factor L1, L2 and L3 may be represented as:

$$L_1 = -\frac{c_1(c_2-1)(c_3-1)(c_2c_3+c_2+c_3)}{(c_1-c_2)(c_1-c_3)(c_1c_2+c_2c_3+c_3c_1)}$$

$$L_2 = -\frac{c_2(c_3-1)(c_1-1)(c_3c_1+c_3+c_1)}{(c_2-c_3)(c_2-c_1)(c_2c_3+c_3c_1+c_1c_2)}$$

$$L_3 = -\frac{c_3(c_1-1)(c_2-1)(c_1c_2+c_1+c_2)}{(c_3-c_1)(c_3-c_2)(c_3c_1+c_1c_2+c_2c_3)},$$

for a fourth band in a frequency range of fs to 2 fs, the correction factor L1, L2 and L3 mat be represented as:

$$L_1 = -\frac{(c_2-1)(c_3-1)}{c_1(c_1-c_2)(c_1-c_3)}$$

$$L_2 = -\frac{(c_3-1)(c_1-1)}{c_2(c_2-c_3)(c_2-c_1)}$$

$$L_3 = -\frac{(c_1-1)(c_2-1)}{c_3(c_3-c_1)(c_3-c_2)},$$

for a fifth band in a frequency range of 2 fs to 3 fs, the correction factor L1, L2 and L3 may be represented as:

$$L_1 = -\frac{(c_2-1)(c_3-1)}{c_1(c_1-c_2)(c_1-c_3)}$$

$$L_2 = -\frac{(c_3-1)(c_1-1)}{c_2(c_2-c_3)(c_2-c_1)}$$

$$L_3 = -\frac{(c_1-1)(c_2-1)}{c_3(c_3-c_1)(c_3-c_2)}$$

and for a sixth band in a frequency range of 3 fs to 4 fs, the correction factor L1, L2 and L3 may be represented as:

$$L_1 = -\frac{(c_2-1)(c_3-1)(1+c_2+c_3)}{c_1^2(c_1-c_2)(c_1-c_3)(c_1+c_2+c_3)}$$

$$L_2 = -\frac{(c_3-1)(c_1-1)(1+c_3+c_1)}{c_2^2(c_2-c_3)(c_2-c_1)(c_1+c_2+c_3)}$$

$$L_3 = -\frac{(c_1-1)(c_2-1)(1+c_1+c_2)}{c_3^2(c_3-c_1)(c_3-c_2)(c_1+c_2+c_3)}$$

The Fourier-transform unit outputs the transformed signal DFTm(r) resulting from a Fourier-transform of the digital signal outputted by the at least two A/D converters, and the spurious elimination means may calculate a Fourier-transform X(f)=X(r/NTs) of the analog signal for the third and fourth bands using a equation given by:

$$X\left(\frac{r}{NTs}\right) = \frac{1}{1+L_1+L_2+L_3}\{DFT_0(r) + L_1 e^{-j2\pi\frac{r}{N}(1+\tau_1/Ts)}DFT_1(r) + L_2 e^{-j2\pi\frac{r}{N}(2+\tau_2/Ts)}DFT_2(r) + L_3 e^{-j2\pi\frac{r}{N}(3+\tau_3/Ts)}DFT_3(r)\},$$

while the spurious elimination means calculates a Fourier-transform X(f)=X(r/NTs) of the analog signal for the fifth and sixth bands using a equation given by:

$$X\left(\frac{r}{NTs}\right) = \frac{1}{1+\sum_{n=1}^{3}c_n^4 L_n}\{DFT_0(r) + L_1 e^{-j2\pi\frac{r}{N}(1+\tau_1/Ts)}DFT_1(r) + L_2 e^{-j2\pi\frac{r}{N}(2+\tau_2/Ts)}DFT_2(r) + L_3 e^{-j2\pi\frac{r}{N}(3+\tau_3/Ts)}DFT_3(r)\}.$$

According to the second aspect of the present invention, a test apparatus for testing an electronic device, comprises a pattern generator for generating a pattern signal and a expectation signal, a waveform adjuster for shaping a waveform of the pattern signal generated by the pattern generator, a device contacting unit for providing the pattern signal shaped by the waveform adjuster to the electronic device installed, and receiving analog signal outputted by the electronic device, a digitizer module for converting the analog signal outputted by the electronic device into digital signal and a decision unit for deciding quality of the electronic device by comparing the expectation signals outputted by the pattern generator with signals outputted by the digitizer module, wherein the digitizer module comprises at least two A/D converters for converting an analog signal outputted by the electronic device into a digital signal, each of the A/D converters operating with different sampling timing, a Fourier-transform unit for performing Fourier-transform on each of the digital signals converted by the at least two A/D converters, and outputting a transformed signal and an interleaving unit for generating a data sequence in which the transformed signal outputted by the Fourier-transform unit is comprised, and the interleaving unit comprises a spurious elimination means for eliminating a spurious component in the transformed signal resulting from a phase error between an ideal sampling timing, with which each of the at least two A/D converters should perform sampling on each of the analog signals, and the sampling timing, with which each of the at least two A/D converters performs sampling on each of the analog signals.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiments are not necessarily essential to the invention.

Figure 1:
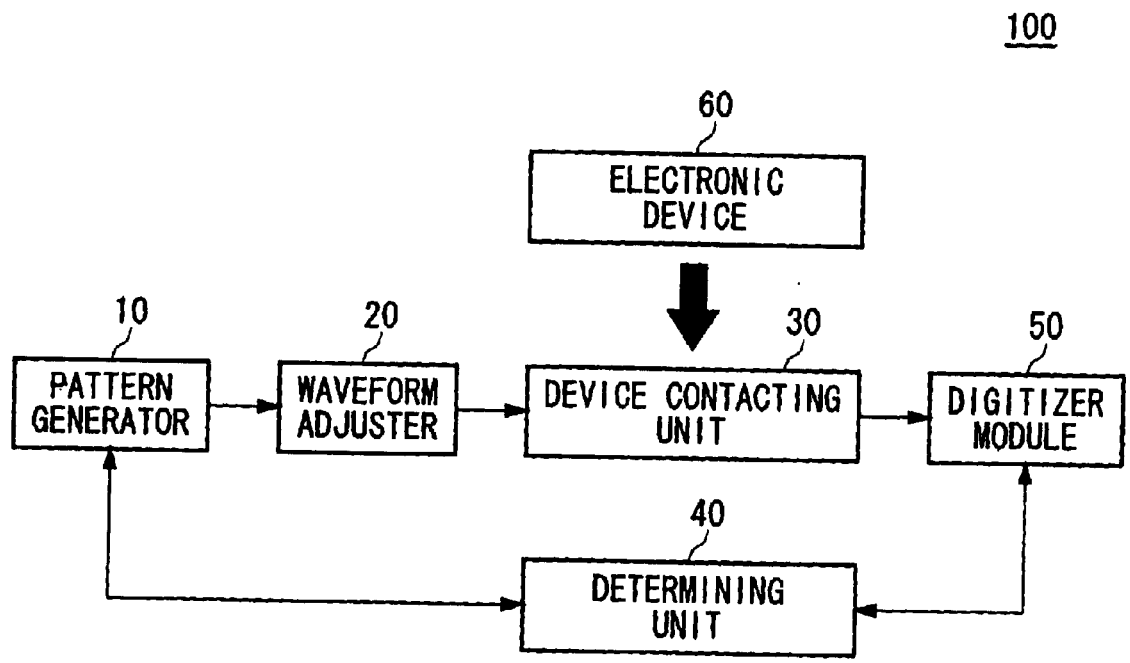
FIG. 1 shows an example of a configuration of a semiconductor test apparatus 100 relating to the present invention.

FIG. 1 shows an example of a configuration of a semiconductor test apparatus 100 relating to the present invention. The test apparatus 100 includes a pattern generator 10, a waveform adjuster 20, a device contacting unit 30, a digitizer module 50 and a decision unit 40. An electronic device 60 to be tested is installed in the device contacting unit 30. The pattern generator 10 generates pattern signals provided to the electronic device 60 and expectation signals, which the electronic device 60 should output in the case of being provided the pattern signals to the electronic device 60. The pattern signals are provided to the waveform adjuster 20. The waveform adjuster 20 shapes waveforms of the pattern signals corresponding to a characteristic of the electronic device 60. The shaped pattern signals are provided to the electronic device 60 through the device contacting unit 30. The electronic device 60 is installed in the device-contacting unit 30. The electronic device 60 outputs analog signals to the digitizer module 50 through the device contacting unit 30 on the basis of the pattern signals inputted. The digitizer module 50 converts the analog signals received into digital signals and provides the digital signals to the decision unit 40. The decision unit 40 decides quality of the electronic device 60 on the basis of the digital signals. The decision unit 40 may decide the quality of the electronic device 60 by comparing the expectation signals generated by the pattern generator 10 with the digital signals from the digitizer.

Figure 2:
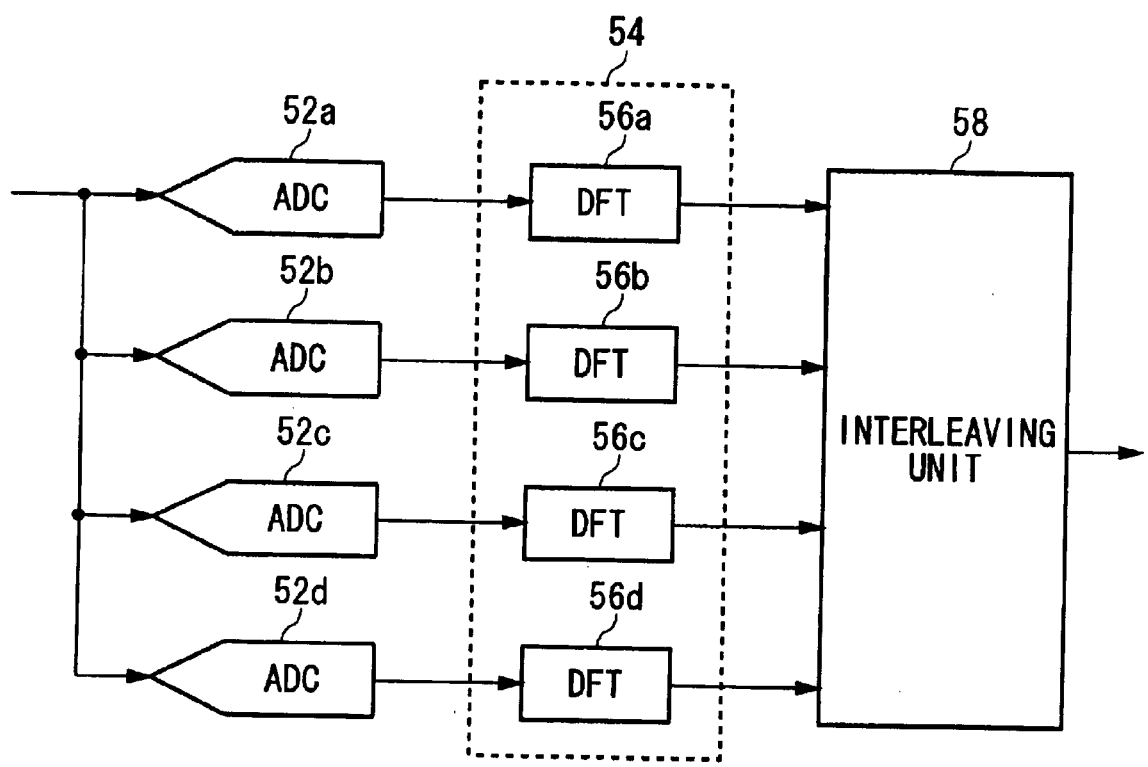
FIG. 2 shows an example of a configuration of a digitizer module 50 relating to the present invention.

FIG. 2 shows an example of a configuration of a digitizer module 50 relating to the present invention. The digitizer module 50 includes N (N is an integer over two) A/D converters (ADC) 52, a Fourier-transform unit 54 and a interleaving unit 58. According to an embodiment of the present invention, the digitizer module 50 includes 4 A/D converters. And according to an embodiment of the present invention, the Fourier-transform unit 54 includes four discrete Fourier-transform units (DFT) 56 corresponding to each of four A/D converters.

The N A/D converters 52 sample the analog signals outputted by the electronic device 60 with different sampling timing respectively and convert the analog signals sampled into the digital signals one by one. The N A/D converters 52 sample the analog signals at actually the same frequency (fs) respectively. According to an embodiment of the present invention, an A/D converter 52a, an A/D converter 52b, an A/D converter 52c and an A/D converter 52d sample the analog signals with a constant time interval one after another so that a sampling frequency of the four A/D converters is 4 fs. However, there is a case that the sampling timing does not have a constant time interval because the four A/D converters sample in turn. There are phase errors between an ideal sampling timing with a constant time interval in a sequence and a sampling timing of a plurality of A/D converters 52. According to an embodiment of the present invention, assuming that a sampling timing of the A/D converters 52a is taken as a reference, ideally it is preferable that the A/D converter 52b, the A/D converter 52c and the A/D converter 52d sample with a constant time interval respectively within a time interval from a sampling timing to the next sampling timing of A/D converter 52a, but actually there is a case that phase errors between the ideal sampling timing and the sampling timing of each of the A/D converter 52b, the A/D converter 52c and the A/D converter 52d arise. The Fourier-transform unit 54 outputs the transformed signals resulting from the Fourier-transform performed on the digital signals respectively by the N A/D converters 52 to the interleaving unit 58. According to an embodiment of the present invention, the Fourier-transform unit 54 includes four discrete Fourier-transform units (DFT) 56.

The interleaving unit 58 generates a data sequence under which each of the transformed signals outputted by a plurality of the Discrete Fourier-transform units 56 of the Fourier-transform unit 54, is arranged in a predetermined sequence. And, the interleaving unit 58 includes a spurious elimination means for eliminating spurious components in each of the transformed signals resulting from the phase errors between the ideal sampling timing with which the N A/D converters should sample the analog signals and the sampling timing with which the N A/D converters sample the analog signals. The interleaving unit 58 may further includes an aliasing elimination means for eliminating aliasing components of the spurious components.

Figure 3:
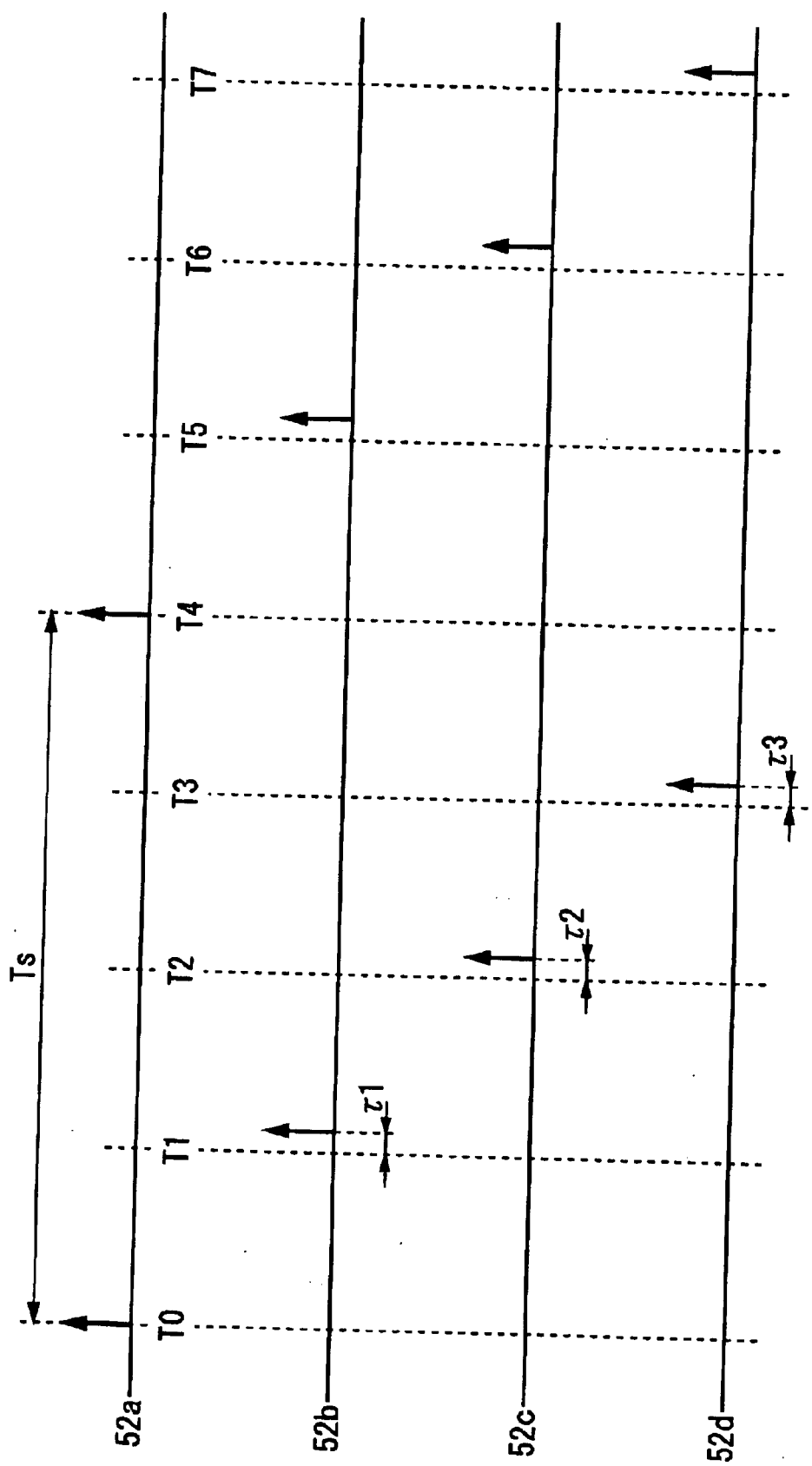
FIG. 3 is a timing chart describing a phase error of sampling timing of N A/D converters 52.

FIG. 3 is a timing chart describing a phase error of sampling timing of the N A/D converters 52. In the FIG. 3, horizontal axes denote time. And, T0, T1, . . . , T7, . . . on a horizontal axis denotes timings with a constant time interval. According to an embodiment of the present invention, the digitizer module 50, as shown in FIG. 3, includes four A/D converters 52. And, each of four A/D converters 52 performs sampling with a phase interval ts. The four A/D converters 52 perform a interleaving sampling on the analog signals outputted by the electronic device 60. In this case, the ideal sampling timing is a constant time interval. However, in the case of sampling using a plurality of A/D converters, it is difficult to perform sampling with a constant time interval. Consequently, there is a case that the phase errors between the sampling timing with which a plurality of A/D converters 52 perform sampling and the ideal sampling timing. For example, as shown FIG. 3, assuming that the A/D converter 52a is taken as a reference, other A/D converters 52 bring about the phase errors $\tau 1, \tau 2$ and $\tau 3$ respectively against the ideal sampling timing. The digitizer module 50 and the test apparatus 100, even if the phase errors arise, can correct the phase errors and perform the Fourier-transform on the analog signals outputted by the electronic device 60 with a precision. The correction of the phase errors is described below with respect to the digitizer module 50 and the test apparatus 100.

Figure 4A:
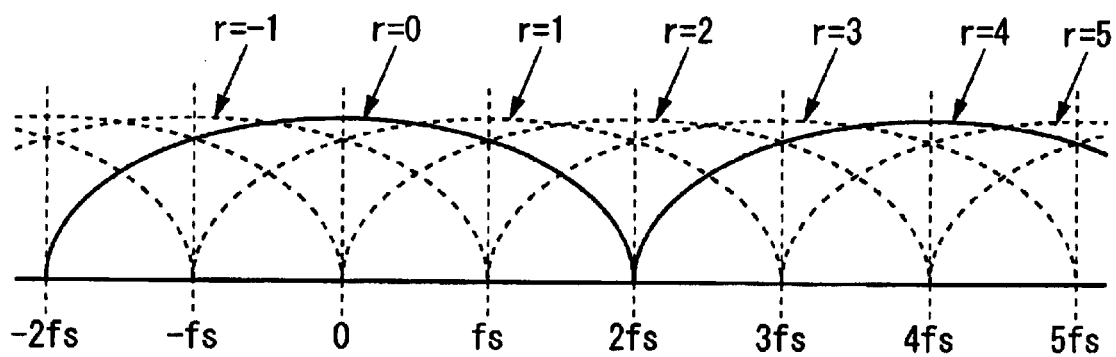
FIG. 4 shows an example of transformed signals outputted by a Fourier-transform unit 54.

FIG. 4 shows an example of the transformed signals outputted by the Fourier-transform unit 54. In FIG. 4, a horizontal axis denotes frequency and a vertical axis denotes amplitude. And in FIG. 4, fs denotes ¼ frequency of a frequency with which each of the four A/D converters 52 performs sampling on the analog signals. That is, fs denotes a sampling frequency, when the four A/D converters 52 perform a interleaving sampling.

A waveform, which is a signal resulting from the ideally Fourier-transform on the analog signals received by the Fourier-transform unit 54, is shown with a solid line in FIG. 4. Ideally, the transformed signals outputted by the Fourier-transform unit 54 are the same as the solid line waveform in FIG. 4, but according to the embodiment of the present invention, the transformed signals, as shown with a broken line, include spurious components nearly the same as the solid line waveform with a period nearly corresponding to the frequency fs, because the Fourier-transform unit 54 performs the interleaving sampling using the four A/D converters. And, a spectrum of the spurious components changes on the basis of the phase errors of the sampling timing of the four A/D converters. According to the embodiment of the present invention, the spurious elimination means eliminates the spurious components. A method with which the spurious elimination means eliminates the spurious components is described below.

The spurious elimination means calculates correction factors on the basis of each of the transformed signals by using the phase errors of the sampling timing of the A/D converters 52 and a boundary condition, under which the spurious component in the transformed signal does not exist, and eliminates the spurious components on the basis of the correction factors. And, the spurious elimination means calculates the correction factors for each of the N transformed signals outputted by the Fourier-transform unit 54 corresponding to each of the N A/D converters 52 and eliminates the spurious components on the basis of the correction factors calculated. For example, the spurious elimination means may multiply each of the N transformed signals by the correction factors calculated for each of the N transformed signals, and calculate the correction factors eliminating components except signal components of the analog signals and the aliasing components of the signal components denoted with a solid line in FIG. 4, when calculating a total sum of the N transformed signals multiplied by the correction factors.

An example of a method for calculating the correction factors is described below with mathematical expressions. A sampling pulse with which the N A/D converters 52 sample the analog signals outputted by the electronic device 60 is generally given by the following equation $$p_m(t) = \sum_{r=-\infty}^{\infty} \sigma\{t - (N \times r + m)Ts) - \tau_m\},$$

where m denotes an integer 0 to N-1, t denotes time, Ts denotes a phase interval of each of the N A/D converters, m denotes m-th A/D converter and T denotes the phase error of the N A/D converters. According to an embodiment of the present invention, the four A/D converters 52 are used, therefore the above equation can be written as following:

$$p_m(t) = \sum_{r=-\infty}^{\infty} \sigma\{t - (4r + m)Ts) - \tau_m\}.$$

The Fourier-transform of sampling series of the analog signals sampled by the N A/D converters is generally given by the following equation $$Xm(f) = \frac{1}{N \times Ts} \sum_{r=-\infty}^{\infty} X\left(f - \frac{r}{N \times Ts}\right) e^{-j\pi\frac{r}{2}\left(m + \frac{\tau m}{Ts}\right)}.$$

That is, the Fourier-transform of sampling series is $$X_0(f) = \bar{x}(-k) + \ldots + \bar{x}(-1) + \bar{x}(0) + \bar{x}(1) + \ldots + \bar{x}(l)$$
$$X_1(f) = c_1^{-k}\bar{x}(-k) + \ldots + c_1^{-1}\bar{x}(-1) + \bar{x}(0) + c_1\bar{x}(1) + \ldots + c_1^l\bar{x}(l)$$
$$X_2(f) = c_2^{-k}\bar{x}(-k) + \ldots + c_2^{-1}\bar{x}(-1) + \bar{x}(0) + c_2\bar{x}(1) + \ldots + c_2^l\bar{x}(l)$$
$$\vdots$$
$$X_{N-1}(f) = c_{N-1}^{-k}\bar{x}(-k) + \ldots + c_{N-1}^{-1}\bar{x}(-1) + \bar{x}(0) + c_{N-1}\bar{x}(1) + \ldots + c_{N-1}^l\bar{x}(l),$$

where in case a band of X(f) is in a range of [-2 fs, 2 fs], terms having r in a range of -k to 1 in the above equation are components within a band [0, 4 fs], and cm and x^(r) are given by the following equation $$c_m = e^{-\frac{j\pi}{2}(r+\tau_m/Ts)}, \bar{x}(r) = \frac{1}{NTs}X\left(f - \frac{r}{NTs}\right).$$

Meanwhile, x^ is a substitute notation for $\bar{x}$.

According to an embodiment of the present invention, the four A/D converters 52 are used, therefore the Fourier-transform of sampling series of the analog signals sampled by the four A/D converters is given by the following equation $$Xm(f) = \frac{1}{4Ts} \sum_{r=-\infty}^{\infty} X\left(f - \frac{r}{4Ts}\right) e^{-j\pi\frac{r}{2}\left(m + \frac{\tau m}{Ts}\right)}.$$

That is, the Fourier-transform of sampling series is $$X_0(f) = \bar{x}(-1) + \bar{x}(0) + \bar{x}(1) + \ldots + \bar{x}(5)$$
$$X_1(f) = c_1^{-1}\bar{x}(-1) + \bar{x}(0) + c_1\bar{x}(1) + \ldots + c_1^5\bar{x}(5)$$
$$X_2(f) = c_2^{-1}\bar{x}(-1) + \bar{x}(0) + c_2\bar{x}(1) + \ldots + c_2^5\bar{x}(5)$$
$$X_3(f) = c_3^{-1}\bar{x}(-1) + \bar{x}(0) + c_3\bar{x}(1) + \ldots + c_3^5\bar{x}(5),$$

where in case a band of X(f) is in a range of [-2 fs, 2 fs], terms having r in a range of -1 to 5 are components within a band [0, 4 fs], and cm and x^(r) are given by the following equation $$c_m = e^{-\frac{j\pi}{2}(r+\tau_m/Ts)}, \bar{x}(r) = \frac{1}{4Ts}X\left(f - \frac{r}{4Ts}\right).$$

And, the terms having r in a range of -1 to 5 are, for example, components as shown in FIG. 3. The digitizer module 50 relating to the present invention eliminates the spurious components in the transformed signals resulting from the interleaving sampling using the N A/D converters 52. According to an embodiment of the present invention, the digitizer module 50 eliminates components for r=-1, 1, 2, 3 and 5 shown in FIG. 4.

In case the aliasing components related to 2 fs, which is a frequency of signal components x^(0), are x^(u), where x^ is a substitute notation for $\bar{x}$, the spurious elimination means included in the interleaving unit 58 calculates the correction factors L1, L2, . . . LN-1 to satisfy the following equation $$X_0(f)+L_1X_1(f)+L_2X_2(f)+\ldots+L_{N-1}X_{N-1}(f)=a\bar{x}(0)+b\bar{x}(u),$$

where either a or b is a random real number, and eliminates the spurious components in the transformed signals on the basis of the correction factors.

That is, the spurious elimination means may multiply the N transformed signals converted at the N A/D converters 52 by the correction factors and calculate a total sum of the transformed signals multiplied by the correction factors. According to an embodiment of the present invention, the digitizer module 50 includes the four A/D converters 52, therefore the above equation is written as following:

$$X_0(f)+L_1X_1(f)+L_2X_2(f)+\ldots+L_3X_3(f)=a\tilde{x}(0)+b\tilde{x}(4).$$

And, the spurious elimination means may calculate the correction factors by dividing a band. Dividing a band enables the spurious elimination means to easily calculate the correction factors. For example, according to an embodiment of the present invention, a band may be divided into four bands such as [0, fs], [fs, 2 fs], [2 fs, 3 fs] and [3 fs, 4 fs] so that the spurious elimination means calculates the correction factors for each of the bands. In this embodiment of the present invention, a band is divided into four bands owing to using the four A/D converters 52, but a band may be divided into N bands in the case of using N A/D converters 52. And, the spurious elimination means may eliminate the spurious components by using the same correction factors for a band among the bands resulting from dividing.

Figure 4B:
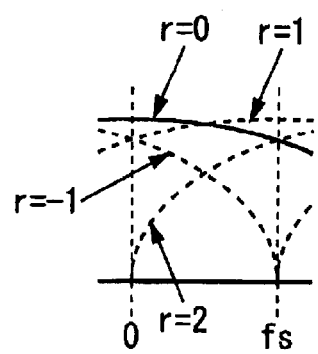

As shown in FIG. 4B, the transformed signals include four components x^(r) for each of the bands resulting from dividing. According to an embodiment of the present invention, the digitizer module 50 calculates the correction factors eliminating the spurious components for each of the bands resulting from dividing. The spurious elimination means calculates the correction factors eliminating components of r=−1, 1 and 2 for the band [0, fs], eliminating components of r=1, 2 and 3 for the band [fs, 2 fs] and the band [2 fs, 3 fs] and eliminating components of r=2, 3 and 5 for the band [3 fs, 4 fs]. The spurious elimination means calculates the correction factors L1, L2 and L3 for each of the bands with the equations above and eliminates the spurious components.

That is, the spurious elimination means eliminates the spurious components for the band [0, fs] on the basis of the correction factors obtained by the following equation $$L_1 = -\frac{c_1(c_2-1)(c_3-1)(c_2c_3+c_2+c_3)}{(c_1-c_2)(c_1-c_3)(c_1c_2+c_2c_3+c_3c_1)}$$

$$L_2 = -\frac{c_2(c_3-1)(c_1-1)(c_3c_1+c_3+c_1)}{(c_2-c_3)(c_2-c_1)(c_2c_3+c_3c_1+c_1c_2)}$$

$$L_3 = -\frac{c_3(c_1-1)(c_2-1)(c_1c_2+c_1+c_2)}{(c_3-c_1)(c_3-c_2)(c_3c_1+c_1c_2+c_2c_3)}.$$

And, the spurious elimination means eliminates the spurious components for the band [fs, 2 fs] and the band [2 fs, 3 fs] on the basis of the correction factors obtained by the following equation $$L_1 = -\frac{(c_2-1)(c_3-1)}{c_1(c_1-c_2)(c_1-c_3)}$$

$$L_2 = -\frac{(c_3-1)(c_1-1)}{c_2(c_2-c_3)(c_2-c_1)}$$

$$L_3 = -\frac{(c_1-1)(c_2-1)}{c_3(c_3-c_1)(c_3-c_1)}.$$

And, the spurious elimination means eliminates the spurious components for the band [3 fs, 4 fs] on the basis of the correction factors obtained by the following equation $$L_1 = -\frac{(c_2-1)(c_3-1)(1+c_2+c_3)}{c_1^2(c_1-c_2)(c_1-c_3)(c_1+c_2+c_3)}$$

$$L_2 = -\frac{(c_3-1)(c_1-1)(1+c_3+c_1)}{c_2^2(c_2-c_3)(c_2-c_1)(c_1+c_2+c_3)}$$

$$L_3 = -\frac{(c_1-1)(c_2-1)(1+c_1+c_2)}{c_3^2(c_3-c_1)(c_3-c_2)(c_1+c_2+c_3)}.$$

And, According to an embodiment of the present invention, the spurious elimination means eliminates the spurious components by calculating a total sum of each of the transformed signals multiplied by the correction factors described above. According to the digitizer module 50 described above, the signal components x^(0) can be obtained for the band [0, 2 fs] and the aliasing components can be obtained for the band [2 fs, 4 fs].

And, the spurious elimination means may correct a phase of the signal components x^(0) and the aliasing components of the signal components, which can be obtained by calculating the total sum of the transformed signals and eliminating the spurious components. That is, the spurious elimination means may correct a phase of the signal components x^(0) and the aliasing components of the signal components, which result from multiplying the correction factors. For example, when the digitizer module 50 performs a interleaving sampling by using the four A/D converters 52, the spurious elimination means calculates the Fourier-transform of sampling series on which the four A/D converters 52 performs a interleaving sampling for the band [0, 2 fs] with the following equation $$X\left(\frac{r}{NTs}\right) = \frac{1}{1+L_1+L_2+L_3}\{DFT_0(r) + L_1 e^{-j2\pi \frac{r}{N}(1+\tau_1/Ts)}DFT_1(r) + L_2 e^{-j2\pi \frac{r}{N}(2+\tau_2/Ts)}DFT_2(r) + L_3 e^{-j2\pi \frac{r}{N}(3+\tau_3/Ts)}DFT_3(r)\}.$$

And, the spurious elimination means calculates the Fourier-transform of sampling series on which the four A/D converters 52 performs a interleaving sampling for the band [2 fs, 4 fs] with the following equation $$X\left(\frac{r}{NTs}\right) = \frac{1}{1+\sum_{n=1}^{3} c_n^4 L_n}\{DFT_0(r) + L_1 e^{-j2\pi \frac{r}{N}(1+\tau_1/Ts)}DFT_1(r) + L_2 e^{-j2\pi \frac{r}{N}(2+\tau_2/Ts)}DFT_2(r) + L_3 e^{-j2\pi \frac{r}{N}(3+\tau_3/Ts)}DFT_3(r)\}.$$

Here, DFTm(r) represents signals outputted by m-th the discrete Fourier-transform unit 58, and generally is given by $$DFT_0(p) = \sum_{n=0}^{\frac{N}{4}-1} x(4nTs) e^{-\frac{j2\pi kp}{n/4}}$$

$$DFT_1(p) = \sum_{n=0}^{\frac{N}{4}-1} x((4n+1)Ts + \tau_1) e^{-\frac{j2\pi kp}{n/4}}$$

$$DFT_2(p) = \sum_{n=0}^{\frac{N}{4}-1} x((4n+2)Ts + \tau_2) e^{-\frac{j2\pi kp}{n/4}}$$

-continued $$DFT_3(p) = \sum_{n=0}^{\frac{N}{4}-1} x((4n+3)Ts + \tau_3) e^{-\frac{j2\pi kp}{n/4}}$$

where, p=0, 1, 2, . . . , N/4−1, and N is the whole number of sampling performed by the four A/D converters 52.

And, the test apparatus 100 including four A/D converters 52 is described in this embodiment of the present invention, but for the test apparatus 100 including N A/D converters 52, the spurious elimination means calculates the Fourier-transform of sampling series on which the N A/D converters 52 performs a interleaving sampling for the band [0, 2 fs] with the following equation $$X\left(\frac{r}{NTs}\right) = \frac{1}{1+L_1+L_2+\ldots+L_{N-1}}\{DFT_0(r) + L_1 e^{-j2\pi\frac{r}{N}(1+\tau_1/Ts)}DFT_1(r) +$$

$$L_2 e^{-j2\pi\frac{r}{N}(2+\tau_2/Ts)}DFT_2(r) \ldots +$$

$$L_{N-1} e^{-j2\pi\frac{r}{N}(N-1+\tau_{N-1}/Ts)}DFT_{N-1}(r)\}.$$

And, the spurious elimination means calculates the Fourier-transform of sampling series on which the N A/D converters 52 performs a interleaving sampling for the band [2 fs, 4 fs] with the following equation $$X\left(\frac{r}{NTs}\right) = \frac{1}{1+\sum_{n=1}^{N-1} c_n^u L_n}\{DFT_0(r) + L_1 e^{-j2\pi\frac{r}{N}(1+\tau_1/Ts)}DFT_1(r) +$$

$$L_2 e^{-j2\pi\frac{r}{N}(2+\tau_2/Ts)}DFT_2(r) \ldots +$$

$$L_{N-1} e^{-j2\pi\frac{r}{N}(N-1+\tau_{N-1}/Ts)}DFT_{N-1}(r)\}.$$

According to the test apparatus 100 and the digitizer module 50 described above, although a sampling frequency is raised owing to the interleaving sampling using the N A/D converters 52, the spurious components on the basis of the phase errors of sampling timing resulting from the Fourier-transform of sampling series can be eliminated so that the electronic device 60 can be tested with high precision. By performing an inverse-Fourier-transform on the transformed signals from which the spurious components are eliminated on the basis of the phase errors, the analog signals outputted by the electronic device 60 can be reproduced with high precision so that deciding with high precision the quality of the electronic device 60 can be achieved.

Figure 5:
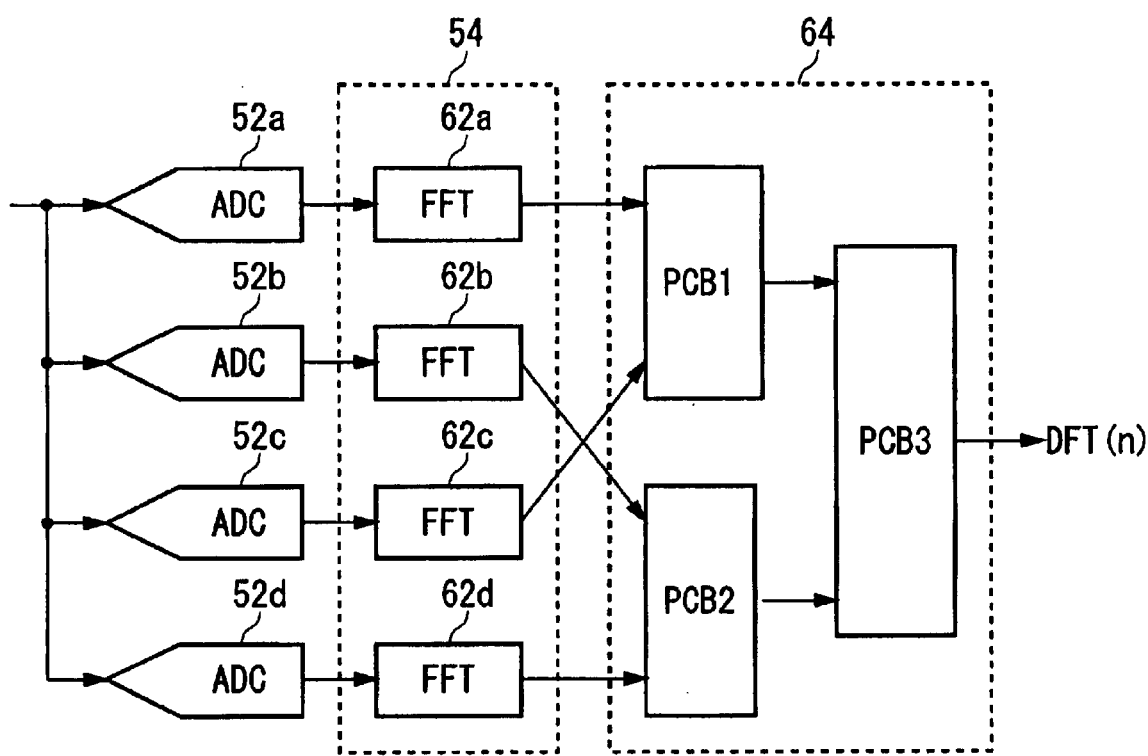
FIG. 5 shows another example of a configuration of a digitizer module 50 relating to the present invention.

FIG. 5 shows another example of a configuration of a digitizer module 50 relating to the present invention. A digitizer module 50 includes N A/D converters (ADC) 52, a Fourier-transform unit 54 and a butterfly operation unit 64. According to an embodiment of the present invention, the digitizer module 50 includes four A/D converters 52. And, According to an embodiment of the present invention, the Fourier-transform unit 54 may include four Fourier-transform processors (FFT) 62 corresponding to each of the four A/D converters 52. Things in FIG. 5, which have the same symbol as in FIG. 2, may have the same or a similar configuration and operation as described in FIG. 2 to FIG. 4.

The N A/D converters 52 converts analog signals outputted the electronic device 60 into digital signals one by one with different sampling timing. The N A/D converters 52 sample the analog signals at actually the same frequency (fs) respectively. According to an embodiment of the present invention, the digitizer module 50 includes four A/D converters 52. An A/D converter 52a, an A/D converter 52b, an A/D converter 52c and an A/D converter 52d sample the analog signals with a constant time interval one after another so that a sampling frequency of the four A/D converters is 4 fs. However, as described above, there is a case that the sampling timing does not have a constant time interval because the four A/D converters sample in turn. Consequently, there may be phase errors between an ideal sampling timing with a constant time interval in a sequence and a real sampling timing of a plurality of A/D converters 52.

The Fourier-transform unit 54 outputs transformed signals resulting from the Fourier-transform on each of the digital signals converted by the N A/D converters 52 to the butterfly operation unit 64. According to an embodiment of the present invention, the Fourier-transform unit 54 includes N Fourier-transform processor (FFT) 62 corresponding to each of the N A/D converters 52. According to an embodiment of the present invention, the Fourier-transform unit 54 includes four Fourier-transform processors 62.

The butterfly operation unit 64 generates signals that the spurious components on the basis of the phase errors are eliminated from each of the transformed signals outputted by a plurality of the Fourier-transform processors 62 of the Fourier-transform unit 54. The butterfly operation unit 64 may eliminate the spurious components with the same methods as described in FIG. 4. A method is described below that the butterfly operation unit 64 eliminates the spurious components.

According to an embodiment of the present invention, the butterfly operation unit 64 includes three phase correction butterfly operation units (PCB). Generally, a relation between an input and an output of the PCB, letting an input of the PCB be DFTeven(n) and DFTodd(n) and an output of the PCB be DFT(n), is given by $$DFT(n) = DFT_{even}(n) + P \times \overline{W}_N(n) \times DFT_{odd}(n)$$

$$\overline{W}_N(n) = e^{-j2\pi(1+\tau/Ts)\frac{n}{N}}$$

$$P = e^{j\pi\tau/Ts}.$$

Here, $\hat{W}_N(n)$ and P are given by, where $\hat{W}_N(n)$ denotes a rotation operator correcting the phase errors T of sampling timing of the A/D converters 52 against the ideal sampling timing, N denotes the number of data after the operation, Ts denotes a sampling interval of data after the operation and r denotes the signal components shown in FIG. 4.

Here, letting an output of a Fourier-transform processor 62a be DFT0(n), an output of a Fourier-transform processor 62b be DFT1(n), an output of a Fourier-transform processor 62c be DFT2(n), an output of a Fourier-transform processor 62d be DFT3(n), an output of a PCB1 be DFTeven(n), an output of a PCB2 be DFTodd(n) and an output of a PCB3 be DFT(n), a relation between an input and an output of each of the PCB1, PCB2 and PCB3 is given by the following equations $$DFT_{even}(n) = DFT_0(n) + P_2 \times e^{-j2\pi\frac{n}{N/2}\left(1+\frac{T_2}{2Ts}\right)} \times DFT_2(n)$$

$$DFT_{odd}(n) = DFT_1(n) + P_3 \times e^{-j2\pi\frac{n}{N/2}\left(1+\frac{T_3-T_1}{2Ts}\right)} \times DFT_3(n)$$

$$DFT(n) = DFT_{even}(n) + P_1 \times e^{-j2\pi\frac{n}{N}\left(1+\frac{T_1}{Ts}\right)} \times DFT_{odd}(n).$$

From the above equations, the following equation is obtained:

$$DFT(n) = DFT_0(n) + P_1 \times e^{-j2\pi \frac{n}{N}\left(1+\frac{T_1}{T_S}\right)} \times DFT_1(n) +$$
$$P_2 \times e^{-j2\pi \frac{n}{N}\left(2+\frac{T_2}{T_S}\right)} \times DFT_2(n) + P_1 P_3 \times e^{-j2\pi \frac{n}{N}\left(3+\frac{T_3}{T_S}\right)} \times DFT_3(n),$$

where P1=L1, P2=L2, P3=L3/L1.

The butterfly operation unit 64, for each of the phase correction butterfly operation units, like the spurious elimination means described in FIG. 4, divides a frequency band into a plurality of bands and performs a phase correction butterfly operation on each of the bands by using phase correction factors L1, L2 and L3. The spurious elimination means may correct the phase of signal component x□(0) and the aliasing components of the signal components, which result from multiplying the correction factors. According to the digitizer module 50 described above, like the digitizer module 50 described in FIG. 2, the spurious components on the basis of the phase errors of sampling timing can be eliminated.

Although the present invention has been described by way of exemplary embodiments, it should be understood that those skilled in the art might make many changes and substitutions without departing from the spirit and the scope of the present invention, which is defined only by the appended claims.

EFFECT OF THE INVENTION

As described above, it is apparent that although a sampling frequency is raised owing to the interleaving sampling using the N A/D converters, the spurious components on the basis of the phase errors of sampling timing resulting from the Fourier-transform of sampling series can be eliminated so that the electronic device can be tested with high precision. By performing an inverse-Fourier-transform on the transformed signals from which the spurious components are eliminated on the basis of the phase errors, the analog signals outputted by the electronic device can be reproduced with high precision so that deciding with high precision the quality of the electronic device can be achieved. And, according to the above embodiments, a dynamic range of an A/D converter interleaved is improved because the spurious components resulting from the phase errors are eliminated. Moreover, in the above embodiments, the phase errors correction does not need additional hardware and requires only a little calculation load. Therefore, considering that as a sampling rate is increased with progress in LSI technology, the conventional A/D converter is substantially damaged by the phase errors during sampling, the digitizer module 50 and the test apparatus 100 are invaluable for the whole semiconductor industry.

What is claimed is:

1. A digitizer module for converting an analog signal outputted by an electronic device into a digital signal, comprising:

at least two A/D converters for converting an analog signal outputted by said electronic device into a digital signal, each of said A/D converters operating with different sampling timing;

a Fourier-transform unit for performing Fourier-transform on each of said digital signals converted by said at least two A/D converters and outputting a transformed signal; and an interleaving unit for generating a data sequence in which said transformed signal outputted by said Fourier-transform unit is comprised, wherein said interleaving unit comprises a spurious elimination means for eliminating a spurious component in said transformed signal resulting from a phase error between an ideal sampling timing, with which each of said at least two A/D converters should perform sampling on each of said analog signals, and said sampling timing, with which each of said at least two A/D converters performs sampling on each of said analog signals.

2. A digitizer module as claimed in claim 1, wherein said interleaving unit further comprises an aliasing elimination means for eliminating an aliasing component of said spurious component.

3. A digitizer module as claimed in claim 1, wherein said spurious elimination means calculates a correction factor on the basis of each of said transformed signals by using said phase error and a boundary condition, under which said spurious component in said transformed signal does not exist, and eliminates said spurious component on the basis of said correction factor.

4. A digitizer module as claimed in claim 3, wherein said spurious elimination means calculates said correction factor for each of said transformed signals outputted by said Fourier-transform unit corresponding to each of said at least two A/D converters, and eliminates said spurious component on the basis of said correction factor.

5. A digitizer module as claimed in claim 3, wherein said ideal sampling timing is defined as a sampling timing with which each of other A/D converters performs sampling in turn at a constant time interval in case one of sampling timings of said at least two A/D converters is regarded as a reference sampling timing, and said spurious elimination means calculates said correction factor on the basis of each of said phase errors between each of sampling timings of said other A/D converters and said ideal sampling timing, and eliminates said spurious component on the basis of said correction factor.

6. A digitizer module as claimed in either claim 4, wherein said spurious elimination means multiplies each of said transformed signals by said correction factor calculated for each of said transformed signals.

7. A digitizer module as claimed in claim 6, wherein said spurious elimination means calculates said correction factor to eliminate components other than a signal component of said analog signal and said aliasing component of said signal component when a total sum of said N transformed signals multiplied by said correction factor are calculated.

8. A digitizer module as claimed in claim 7, wherein said spurious elimination means calculates said correction factor for each of a plurality of bands, into which a band of said transformed signal is divided, on the basis of a phase of sampling timing of said at least two A/D converters.

9. A digitizer module as claimed in claim 7, wherein said spurious elimination means calculates said correction factor by using a simultaneous equation.

10. A digitizer module as claimed in claim 7, wherein a sampling pulse, with which said at least two A/D converters perform sampling on said analog signal, is given by:

$$p_m(t) = \sum_{\gamma=-\infty}^{\infty} \sigma\{(t - (N \times r + m)T_S) - \tau_m\},$$

where N denotes the number of said at least two A/D converters, m denotes an integer in a range of 0(zero) to (N-1), t denotes time, Ts denotes a phase interval of each of said at least two A/D converters, m denotes an m-th A/D converter andτ denotes said phase error of said at least two A/D converters, a Fourier-transform of sampling series of said analog signal sampled by said at least two A/D converters is given by:

$$Xm(f) = \frac{1}{N \times Ts} \sum_{r=-\infty}^{\infty} X\left(f - \frac{r}{N \times Ts}\right) e^{-j\pi \frac{r}{2}(m + \frac{\tau m}{Ts})},$$

that is, $$X_0(f) = \bar{x}(-k) + \ldots + \bar{x}(-1) + \bar{x}(0) + \bar{x}(1) + \ldots + \bar{x}(l)$$

$$X_1(f) = c_1^{-k}\bar{x}(-k) + \ldots + c_1^{-1}\bar{x}(-1) + \bar{x}(0) + c_1\bar{x}(1) + \ldots + c_1^l\bar{x}(l)$$

$$X_2(f) = c_2^{-k}\bar{x}(-k) + \ldots + c_2^{-1}\bar{x}(-1) + \bar{x}(0) + c_2\bar{x}(1) + \ldots + c_2^l\bar{x}(l)$$

$$\vdots$$

$$X_{N-1}(f) = c_{N-1}^{-k}\bar{x}(-k) + \ldots + c_{N-1}^{-1}\bar{x}(-1) + \bar{x}(0) + c_{N-1}\bar{x}(1) + \ldots + c_{N-1}^l\bar{x}(l),$$

(where, in case a band of X(f) is [−2 fs, 2 fs], terms having r in a range of −k to 1 in the above equation are components within a band [0, 4 fs], and are $c_m$ and x(r) are respectively given by:

$$c_m = e^{-\frac{j\pi}{2}(r + \tau_m/Ts)}, \quad \bar{x}(r) = \frac{1}{NTs}X\left(f - \frac{r}{NTs}\right),$$

and in case said aliasing component related to 2 fs, which is a frequency of signal component x^(0), is x^(u) (where x^ is a substitute notation for x̄.), said spurious elimination means calculates said correction factor L1, L2, ... LN-1 to satisfy a equation given by:

$$X_0(f) + L_1X_1(f) + L_2X_2(f) + \ldots + L_{N-1}X_{N-1}(f) = a\bar{x}(0) + b\bar{x}(u),$$

where either a or b is a random real number.

11. A digitizer module as claimed in claim 10, wherein said Fourier-transform unit outputs said transformed signal DFTm(r) resulting from a Fourier-transform of said digital signal outputted by said at least two A/D converters, and for a first band, in which said signal component x^(0) exists, said spurious elimination means calculates a Fourier-transform X(f)=X(r/NTs) of said analog signal using a equation given by:

$$X\left(\frac{r}{NTs}\right) = \frac{1}{1 + L_1 + L_2 + \ldots + L_{N-1}} \{DFT_0(r) + L_1 e^{-j2\pi \frac{r}{N}(1 + \tau_1/Ts)}DFT_1(r) +$$

$$L_2 e^{-j2\pi \frac{r}{N}(2 + \tau_2/Ts)}DFT_2(r) \ldots +$$

$$L_{N-1} e^{-j2\pi \frac{r}{N}(N-1 + \tau_{N-1}/Ts)}DFT_{N-1}(r)\},$$

while for a second band, in which aliasing component x^(u) of said signal component x^(0) exists, said spurious elimination means calculates a Fourier-transform X(f)=X(r/NTs) of said analog signal using a equation given by:

$$X\left(\frac{r}{NTs}\right) = \frac{1}{1 + \sum_{n=1}^{N-1} c_n^u L_n} \{DFT_0(r) + L_1 e^{-j2\pi \frac{r}{N}(1 + \tau_1/Ts)}DFT_1(r) +$$

$$L_2 e^{-j2\pi \frac{r}{N}(2 + \tau_2/Ts)}DFT_2(r) \ldots +$$

$$L_{N-1} e^{-j2\pi \frac{r}{N}(N-1 + \tau_{N-1}/Ts)}DFT_{N-1}(r)\}.$$

12. A digitizer module as claimed in claim 11, wherein said first band is in a frequency range of 0 to 2 fs, and said second band is in a frequency range of 2 fs to frequency 4 fs.

13. A digitizer module as claimed in claim 7 comprising four A/D converters, wherein a sampling pulse with which said four A/D converters perform sampling on said analog signal is given by:

$$p_m(t) = \sum_{r=-\infty}^{\infty} \sigma\{(t - (4r + m)Ts) - \tau_m\},$$

where m denotes an integer 0 to 3, t denotes time, Ts denotes a phase interval of each of said four A/D converters, m denotes an m-th A/D converter andτ denotes said phase error of each of said four A/D converters, a Fourier-transform of sampling series of said analog signal sampled by each of said four A/D converters is given by:

$$Xm(f) = \frac{1}{4Ts} \sum_{r=-\infty}^{\infty} X\left(f - \frac{r}{4Ts}\right) e^{-j\pi \frac{r}{2}(m + \frac{\tau m}{Ts})},$$

that is, $$X_0(f) = \bar{x}(-1) + \bar{x}(0) + \bar{x}(1) + \ldots + \bar{x}(5)$$

$$X_1(f) = c_1^{-1}\bar{x}(-1) + \bar{x}(0) + c_1\bar{x}(1) + \ldots + c_1^5\bar{x}(5)$$

$$X_2(f) = c_2^{-1}\bar{x}(-1) + \bar{x}(0) + c_2\bar{x}(1) + \ldots + c_2^5\bar{x}(5)$$

$$X_3(f) = c_3^{-1}\bar{x}(-1) + \bar{x}(0) + c_3\bar{x}(1) + \ldots + c_3^5\bar{x}(5),$$

(where, in case a band of X(f) is [−2 fs, 2 fs], terms having r in a range of −1 to 5 in the above equation are components within a band [0, 4 fs], and $c_m$ and x(r) are respectively given by:

$$c_m = e^{-\frac{j\pi}{2}(r + \tau_m/Ts)}, \quad \bar{x}(r) = \frac{1}{4Ts}X\left(f - \frac{r}{4Ts}\right),$$

and in case said aliasing component related to 2 fs, which is a frequency of signal component x^(0), is x^(4) (where x^ is a substitute notation for x̄), said spurious elimination means calculates said correction factor L1, L2 and L3 to satisfy a equation given by:

$$X_0(f) + L_1X_1(f) + L_2X_2(f) + \ldots + L_3X_3(f) = a\bar{x}(0) + b\bar{x}(4),$$

where either a or b is a random real number.

14. A digitizer module as claimed in claim 13, wherein for a third band in a frequency range of 0 to fs, said correction factor L1, L2 and L3 are represented as:

$$L_1 = -\frac{c_1(c_2 - 1)(c_3 - 1)(c_2c_3 + c_2 + c_3)}{(c_1 - c_2)(c_1 - c_3)(c_1c_2 + c_2c_3 + c_3c_1)}$$

$$L_2 = -\frac{c_2(c_3 - 1)(c_1 - 1)(c_3c_1 + c_3 + c_1)}{(c_2 - c_3)(c_2 - c_1)(c_2c_3 + c_3c_1 + c_1c_2)}$$

-continued $$L_3 = -\frac{c_3(c_1-1)(c_2-1)(c_1c_2+c_1+c_2)}{(c_3-c_1)(c_3-c_2)(c_3c_1+c_1c_2+c_2c_3)},$$

for a fourth band in a frequency range of fs to 2 fs, said correction factor L1, L2 and L3 are represented as:

$$L_1 = -\frac{(c_2-1)(c_3-1)}{c_1(c_1-c_2)(c_1-c_3)}$$

$$L_2 = -\frac{(c_3-1)(c_1-1)}{c_2(c_2-c_3)(c_2-c_1)}$$

$$L_3 = -\frac{(c_1-1)(c_2-1)}{c_3(c_3-c_1)(c_3-c_2)};$$

for a fifth band in a frequency range of 2 fs to 3 fs, said correction factor L1, L2 and L3 are represented as:

$$L_1 = -\frac{(c_2-1)(c_3-1)}{c_1(c_1-c_2)(c_1-c_3)}$$

$$L_2 = -\frac{(c_3-1)(c_1-1)}{c_2(c_2-c_3)(c_2-c_1)}$$

$$L_3 = -\frac{(c_1-1)(c_2-1)}{c_3(c_3-c_1)(c_3-c_2)}$$

and for a sixth band in a frequency range of 3 fs to 4 fs, said correction factor L1, L2 and L3 are represented as:

$$L_1 = -\frac{(c_2-1)(c_3-1)(1+c_2+c_3)}{c_1^2(c_1-c_2)(c_1-c_3)(c_1+c_2+c_3)}$$

$$L_2 = -\frac{(c_3-1)(c_1-1)(1+c_3+c_1)}{c_2^2(c_2-c_3)(c_2-c_1)(c_1+c_2+c_3)}$$

$$L_3 = -\frac{(c_1-1)(c_2-1)(1+c_1+c_2)}{c_3^2(c_3-c_1)(c_3-c_2)(c_1+c_2+c_3)}.$$

15. A digitizer module as claimed in claim 14, wherein said Fourier-transform unit outputs said transformed signal DFTm(r) resulting from a Fourier-transform of said digital signal outputted by said at least two A/D converters, and said spurious elimination means calculates a Fourier-transform X(f)=X(r/NTs) of said analog signal for said third and fourth bands using a equation given by:

$$X\left(\frac{r}{NTs}\right) = \frac{1}{1+L_1+L_2+L_3}\{DFT_0(r) + L_1 e^{-j2\pi\frac{r}{N}(1+\tau_1/Ts)}DFT_1(r) + L_2 e^{-j2\pi\frac{r}{N}(2+\tau_2/Ts)}DFT_2(r) + L_3 e^{-j2\pi\frac{r}{N}(3+\tau_3/Ts)}DFT_3(r)\},$$

while said spurious elimination means calculates a Fourier-transform X(f)=X(r/NTs) of said analog signal for said fifth and sixth bands using a equation given by:

$$X\left(\frac{r}{NTs}\right) = \frac{1}{1+\sum_{n=1}^{3} c_n^4 L_n}\{DFT_0(r) + L_1 e^{-j2\pi\frac{r}{N}(1+\tau_1/Ts)}DFT_1(r) + L_2 e^{-j2\pi\frac{r}{N}(2+\tau_2/Ts)}DFT_2(r) + L_3 e^{-j2\pi\frac{r}{N}(3+\tau_3/Ts)}DFT_3(r)\}.$$

16. A test apparatus for testing an electronic device, comprising:

a pattern generator for generating a pattern signal and a expectation signal;

a waveform adjuster for shaping a waveform of said pattern signal generated by said pattern generator;

a device contacting unit for providing said pattern signal shaped by said waveform adjuster to said electronic device installed, and receiving analog signal outputted by said electronic device;

a digitizer module for converting said analog signal outputted by said electronic device into digital signal; and a decision unit for deciding quality of said electronic device by comparing said expectation signals outputted by said pattern generator with signals outputted by said digitizer module, wherein said digitizer module comprises:

at least two A/D converters for converting an analog signal outputted by said electronic device into a digital signal, each of said A/D converters operating with different sampling timing;

a Fourier-transform unit for performing Fourier-transform on each of said digital signals converted by said at least two A/D converters, and outputting a transformed signal; and an interleaving unit for generating a data sequence in which said transformed signal outputted by said Fourier-transform unit is comprised, and said interleaving unit comprises a spurious elimination means for eliminating a spurious component in said transformed signal resulting from a phase error between an ideal sampling timing, with which each of said at least two A/D converters should perform sampling on each of said analog signals, and said sampling timing, with which each of said at least two A/D converters performs sampling on each of said analog signals.

* * * * *

UNITED STATES PATENT AND TRADEMARK OFFICE
CERTIFICATE OF CORRECTION

PATENT NO. : 6,801,145 B2
DATED : October 5, 2004
INVENTOR(S) : Koji Asami

It is certified that error appears in the above-identified patent and that said Letters Patent is hereby corrected as shown below:

Column 17,
Line 37, replace the following equation $$X_0(f)+L_1X_1(f)+L_2X_2(f) + \cdots +L_{N-1}(f)=a\overline{x}(0)+b\overline{x}(u)$$

to read as follows:

$$-- X_0(f)+L_1X_1(f)+L_2X_2(f) + \cdots +L_{N-1}X_{N-1}(f)=a\overline{x}(0)+b\overline{x}(u) --$$

Signed and Sealed this

Twenty-second Day of March, 2005

JON W. DUDAS
*Director of the United States Patent and Trademark Office*